(12) United States Patent
Swerts et al.

(10) Patent No.: US 10,170,687 B2
(45) Date of Patent: Jan. 1, 2019

(54) SPIN TORQUE MAJORITY GATE DEVICE

(71) Applicant: IMEC VZW, Leuven (BE)

(72) Inventors: Johan Swerts, Kessel-Lo (BE); Mauricio Manfrini, Leuven (BE); Christoph Adelmann, Wilsele (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/387,350

(22) Filed: Dec. 21, 2016

(65) Prior Publication Data

US 2017/0179373 A1 Jun. 22, 2017

(30) Foreign Application Priority Data

Dec. 21, 2015 (EP) ..................................... 15201625

(51) Int. Cl.
*H01L 43/02* (2006.01)
*H01L 27/22* (2006.01)
*H01L 43/10* (2006.01)
*H01L 43/12* (2006.01)

(52) U.S. Cl.
CPC .............. *H01L 43/02* (2013.01); *H01L 27/22* (2013.01); *H01L 43/10* (2013.01); *H01L 43/12* (2013.01)

(58) Field of Classification Search
CPC ......... H01L 43/02; H01L 43/10; H01L 43/12; H01L 27/22
See application file for complete search history.

(56) References Cited

U.S. PATENT DOCUMENTS

| 2011/0096443 A1* | 4/2011 | Zhang ................. C23C 14/165 360/324.2 |
| 2012/0193736 A1* | 8/2012 | Mather ................ G01R 33/098 257/421 |
| 2013/0201757 A1* | 8/2013 | Li ....................... G11C 11/1659 365/171 |
| 2013/0208536 A1* | 8/2013 | Allenspach ............ B82Y 10/00 365/158 |
| 2016/0049185 A1* | 2/2016 | Lu ....................... G11C 11/1659 365/158 |

OTHER PUBLICATIONS

Nikonov, D., et al. "Proposal of a Spin Torque Majority Gate Logic", *IEEE Electron Device Letters*, Aug. 2011, vol. 32, No. 8, pp. 1128-1130.

* cited by examiner

*Primary Examiner* — Mark Tornow
(74) *Attorney, Agent, or Firm* — Knobbe, Martens, Olson & Bear LLP

(57) ABSTRACT

The disclosed technology relates generally to magnetic devices, and more particularly to spin torque majority gate devices such as spin torque magnetic devices (STMG), and to methods of fabricating the same. In one aspect, a majority gate device includes a plurality of input zones and an output zone. A magnetic tunneling junction (MTJ) is formed in each of the input zones and the output zone, where the MTJ includes a non-magnetic layer interposed between a free layer stack and a hard layer. The free layer stack in turn includes a bulk perpendicular magnetic anisotropy (PMA) layer on a seed layer, a magnetic layer formed on and in contact with the bulk PMA layer, and a non-magnetic layer formed on the magnetic layer. Each of the bulk PMA layer and the seed layer is configured as a common layer for each of the input zones and the output zone.

18 Claims, 13 Drawing Sheets

SPIN TORQUE MAJORITY GATE DEVICE

CROSS-REFERENCE TO RELATED APPLICATIONS

This application claims foreign priority to European Patent Application No. EP 15201625, filed Dec. 21, 2015, the content of which is incorporated by reference herein in its entirety.

BACKGROUND

Field

The disclosed technology relates generally to magnetic devices, and more particularly to spin torque majority gate devices such as spin torque magnetic devices (STMG), and to methods of fabricating the same.

Description of the Related Technology

As traditional logic circuits based on CMOS continue to scale in physical dimensions, the power consumption per unit area can also correspondingly increase. As an alternative to logic circuitry based on CMOS, what is known as spintronics has been proposed. In spintronics, magnetization of devices is used to generate the computing signals, instead of electric charge-based signals used in CMOS logic circuitry. Using properties of spintronics, a type of device referred to as majority gate devices can be built, e.g., spin torque majority gate (STMG) devices. A STMG device is a logic device whose output depends on the majority of states of its multiple inputs.

In an article of Nikonov et al. entitled "Proposal of a Spin Torque Majority Gate Logic" as published in IEEE Electron Device Letters 32 (8) in August 2011, a possible layout is disclosed of a spin majority gate device with perpendicular magnetization. As described herein, a perpendicular magnetization refers to a net magnetization of a ferromagnetic layer whose direction is aligned along a direction (e.g., z direction) that is perpendicular to a plane (e.g., x-y plane) formed by ferromagnetic layer. An example layout of a SMTG device is schematically illustrated in FIG. 1 (a top-down plan view), whose cross-sectional side view is illustrated in FIG. 2. The illustrated spin torque majority gate device 1 has of a common free (switchable) ferromagnetic (FM) layer 202 (on a substrate 100) and thereon four independent fixed FM layers 2181, 2182, 2183, 2191 in three nanopillars 218 and one nanopillar 219, respectively. The three nanopillars 218 are configured as inputs, and the one nanopillar 219 is configured as an output. The free FM layer 202 and fixed FM layers 2181, 2182, 2183, 2191 are separated by a non-magnetic spacer layer 204. The arrows designate the magnetization directions. The operation of the device is based on spin torque transfer. The device operates by applying a positive or negative voltage to each input nanopillar 218, which thereby determines the directions of current flowing through each nanopillar 218 and the resulting spin torques. The corresponding logic state for each input nanopillar is the logical "0" and "1" for a negative of positive input voltage respectively. The free FM layer 202 can thus also be in one of the two states of magnetization, up (not shown) or down (shown by the arrow 2021, being 'down' in FIG. 2), depending on the input signal and corresponding to the logical "0" and "1" output signal. Spin torques act to retain the gate in its state or to switch it to the opposite state, depending on the free FM layer magnetization direction and the voltage applied to the input pillars. The majority of the torques determines the outcome (i.e. output signal). The state of magnetization is detected by measuring the tunnel magnetoresistance (TMR) between the free 202 and the fixed layers 2191 by the output pillar 219.

Top-pinned magnetic tunneling junctions (MTJs) with perpendicular anisotropy (PMA) can be advantageous for the input and output pillars due to their improved scalability for smaller feature sizes.

However, fabricating such a magnetic stack poses challenges. Some top-pinned MTJs need to be partially etched to enable a freestanding common free layer 202 having the PMA that is shared between the different input 218 and output 219 pillars. For processing such top-pinned MTJs, the etch process should stop selectively on the non-magnetic spacer layer 204, which can be formed of MgO with a thickness of about 1 nm. In such processes, any residual magnetic or conductive material on top of the non-magnetic spacer layer 204 can be detrimental. However, etch species can penetrate as much as a few nanometers, and can thus easily penetrate into or through the non-magnetic spacer layer 204. Damage to the non-magnetic spacer layer 204 and to the interface between the common free layer 202 and the non-magnetic spacer layer 204 can cause a loss of PMA, a loss of tunnel magneto resistance (TMR) and result in non-functional STMG devices.

There is thus a need to overcome these issues and provide improved STMG devices.

SUMMARY OF CERTAIN INVENTIVE ASPECTS

It is an object of embodiments of the present disclosure to provide an improved majority gate device and a manufacturing method for such a device.

According to a first aspect, a majority gate device comprises: a set of distinct input zones; an output zone; each zone comprising a non-magnetic layer sandwiched in between a free layer stack and a hard layer, the free layer stack comprising a bulk PMA layer on a seed layer; on the bulk PMA layer a magnetic layer being in contact with the non-magnetic layer; and each zone at least sharing the bulk PMA layer and the seed layer. The bulk PMA layer and the seed layer are thus common layers for the input zones and output zone.

According to embodiments, each zone may also share the magnetic layer.

According to embodiments, each zone may also share the non-magnetic layer.

According to embodiments, each zone may also share an oxidized part of the hard layer.

According to embodiments, the bulk PMA layer may comprise a predetermined repetition of a bilayer comprising a first layer and a second layer.

According to embodiments, the predetermined repetition may be 2 or more times.

According to embodiments, the first layer and second may have a thickness in the range of 0.2 nm and 2 nm.

According to embodiments, the first layer may comprise any of FeB, Fe, Co, FeCo and the second layer comprises any of Ni, Pd, Pt, Tb, TbCo, TbFe.

According to embodiments, the bulk PMA layer may comprise any of FePt, CoPt, TbCoFe alloys and $Mn_xA_y$ alloy wherein A is chosen from Al, Ga or Ge and 0<x,y.

According to embodiments, the free magnetic layer may further comprise an interface layer sandwiched in between the magnetic layer and the intrinsic bulk PMA multilayer.

According to embodiments, each zone may also share the interface layer.

According to embodiments, the interface layer may comprise a material suitable for enhancing the texture of the magnetic layer and providing ferromagnetic coupling between the bulk PMA layer and the magnetic layer.

According to embodiments, the interface layer may comprise a material chosen from Ta, Mo, W, V, Ru or an alloy chosen from any of CoFeBX, CoX, FeX, FeCoX with X chosen from any of Ta, Mo, W, V, Ru.

According to embodiments, the seed layer may comprise any of Pt, Ru, Ta, NiCr, Hf, TaN, W, Mo and any combinations thereof.

According to embodiments, the magnetic layer may comprise any of Fe, CoFe, CoFeB, FeB, CoB, and any combinations thereof.

According to embodiments, a zone may comprise a patterned pillar. The patterned pillar comprises the non-shared layers. The non-shared layers may comprise the hard layer; or the hard layer and the non-magnetic layer; or the hard layer, the non-magnetic layer and the interface layer; or the hard layer, the non-magnetic layer, the interface layer and the free layer; or the hard layer, the non-magnetic layer, the interface layer, the free layer and top part of the bulk PMA layer.

According to a second aspec, a method for manufacturing a majority gate device comprises: providing a stack of layers comprising providing a seed layer; providing on the seed layer an intrinsic bulk PMA multilayer; providing on the intrinsic bulk PMA multilayer a ferromagnetic layer; providing on the ferromagnetic layer a non-magnetic layer; providing on the non-magnetic layer a hard layer; forming a set of distinct input zones and an output zone comprising patterning at least part of the hard layer.

According to embodiments, the method may further comprise providing an interfacial layer on the intrinsic bulk PMA multilayer before the step of providing the ferromagnetic layer.

According to embodiments, forming the set of distinct input zones and the output zone may further comprise patterning the hard layer and patterning the non-magnetic layer after patterning the hard layer.

According to embodiments, forming the set of distinct input zones and the output zone may further comprise patterning the ferromagnetic layer after patterning the non-magnetic layer.

According to embodiments, forming the set of distinct input zones and the output zone may further comprise oxidizing the non-patterned part of the hard layer.

It is an advantage of the majority gate device according to the present disclosure that the majority gate device can be scaled to a smaller size than the majority gate realized with CMOS transistors.

It is an advantage of the majority gate device according to the present disclosure that it is compatible with current CMOS manufacturing technologies and current etching techniques to pattern the proposed layouts.

It is an advantage of the majority gate device according to the present disclosure that the device is very scalable.

It is an advantage of the majority gate device according to the present disclosure that the device works for large effective anisotropy i.e. large thermal stability. Therefore, the retention time can be large; a logic device that is non-volatile can be made. This means it does not suffer from standby power dissipation.

It is an advantage of the majority gate device according to the present disclosure that it has a reliable switching behavior independent of the input combination.

It is an advantage of the majority gate device according to the present disclosure that it is compatible with current lithography processing, wherein critical dimension can be large maintaining compactness of the device.

It is an advantage that very compact logic circuits may be build. These logic devices can be fabricated in the metal layers (back-end of line/interconnect) and can be combined with logic layer in the front-end (i.e. at transistor level). This has the advantage allowing for three dimensional stacking of devices.

It is an advantage of the majority gate device according to the present disclosure that it comprises materials which are CMOS compatible.

BRIEF DESCRIPTION OF THE DRAWINGS

All drawings are intended to illustrate some aspects and embodiments of the present disclosure. The drawings described are only schematic and are non-limiting.

DETAILED DESCRIPTION OF CERTAIN ILLUSTRATIVE EMBODIMENTS

Figure 1:
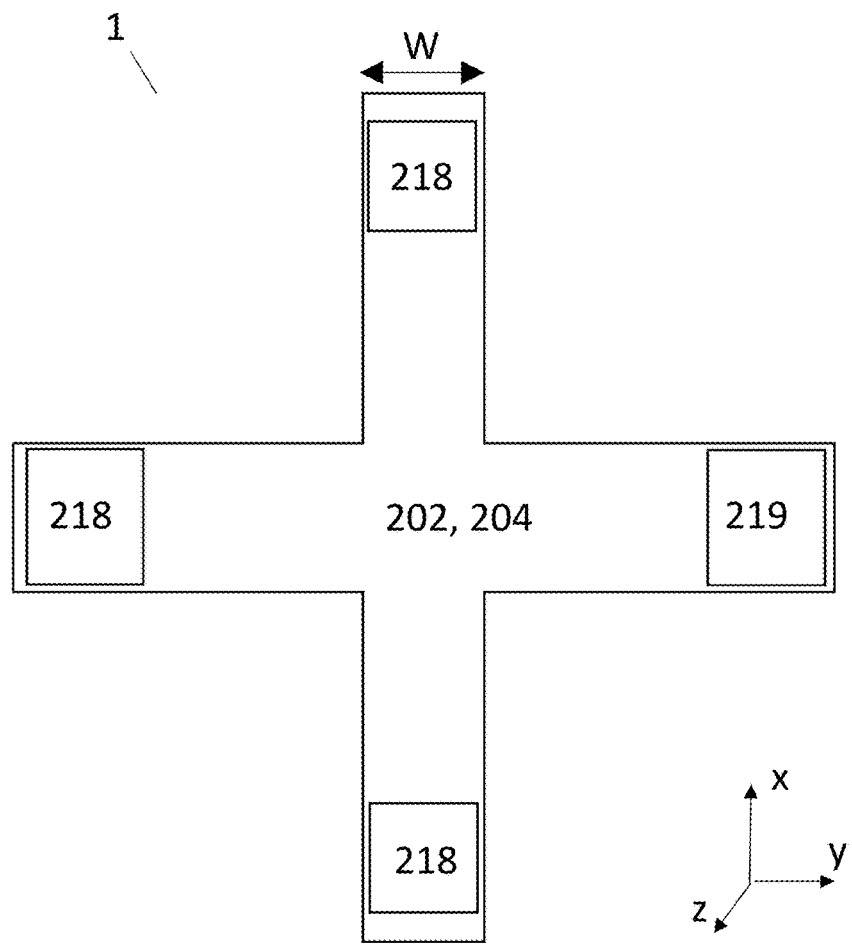
FIG. 1 shows a schematic plan view of an example spin torque majority gate (STMG) device arranged as a crossbar structure.

The disclosed technology will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

As described herein, a '+' (plus) sign in the figures or the description, made in reference to a ferromagnetic layer having a downwards magnetization, indicates a positive voltage being applied, resulting in an upwards magnetization. A ferromagnetic layer having an upward magnetization may alternatively be referred to as having an 'UP' spin torque. As described herein, a '−' (minus) sign in the figures or the description, made in reference to a reference ferromagnetic layer having a downwards magnetization, indicates a negative voltage being applied, resulting in a downwards magnetization. A ferromagnetic layer having a downward magnetization may alternatively be referred to as having a 'DOWN' spin torque. It is clear for a person skilled in the art the opposite applies for a reference ferromagnetic layer having an upwards magnetization. In this case applying a positive voltage ('+') results in a downwards magnetization, or a 'DOWN' spin torque, and applying a negative voltage ('−') results in an upwards magnetization, or an 'UP' spin torque.

When referring to 'out-of-plane', this means magnetic domains are pointing either 'UP' or 'DOWN', i.e. out of the (surface) plane of the ferromagnetic layer but, of course, the domain walls are in-plane, i.e. in the plane of the (surface) plane. For the ease of understanding a three dimensional Cartesian coordinate system may be used with (x,y) defining the surface plane (of the free ferromagnetic layer) and the z-axis defining the 'UP' or 'DOWN' magnetization state.

Each input zone and the output zone corresponds to a magnetic domain of the free ferromagnetic material, each magnetic domain having a magnetization state. If two or three input zones have a magnetization being 'UP', then the magnetization of the magnetic domain corresponding to the output zone should be 'UP', being equal to the majority magnetization of the three input zones. If two or three input zones have a magnetization being 'DOWN', then the magnetization of the magnetic domain corresponding to the output zone should be 'DOWN', being equal to the majority magnetization of the three input zones.

Wherever the term patterning is used, it involves preferably a lithographic step comprising exposing a photoresist layer through a mask and developing the exposed photoresist layer to form a patterned photoresist and thereafter etching the underlying material using the exposed photoresist layer as a mask to thereby form the patterned structure in the underlying material. Suitable etching chemistries are well known for a person skilled in the art. The lithographic patterning may involve immersion lithography, ultra violet (UV), a deep ultraviolet (DUV) or extreme ultra violet (EUV) lithography, electron beam (e-beam) lithography. Alternatively directed self-assembly (DSA) may be used for patterning.

With reference to FIGS. 3, 4, 5, 12, 13 a majority gate device according to different embodiments of the present disclosure will now be explained in more detail.

Figure 3:
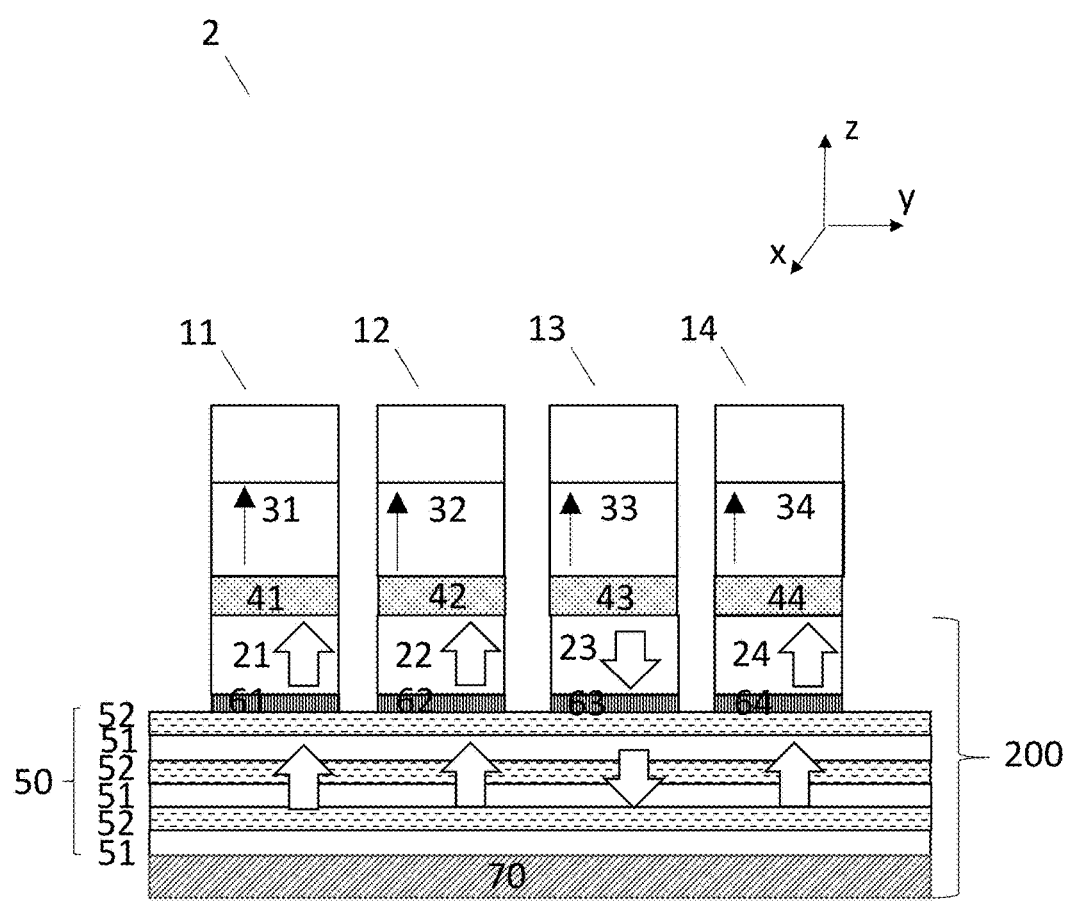
FIG. 3 shows a schematic cross-sectional side view of a majority gate device, according to embodiments of the present disclosure.
Figure 4:
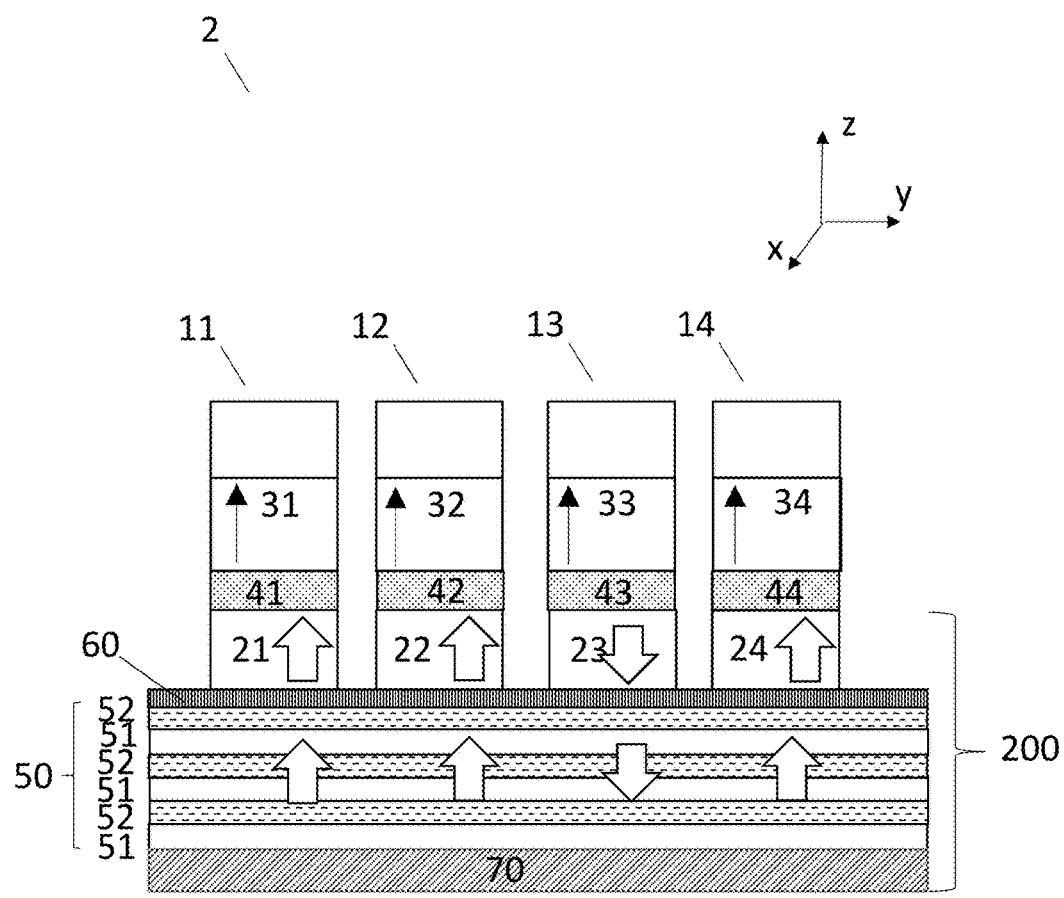
FIG. 4 shows a schematic cross-sectional side view of a majority gate device according to alternative embodiments of the present disclosure.
Figure 5:
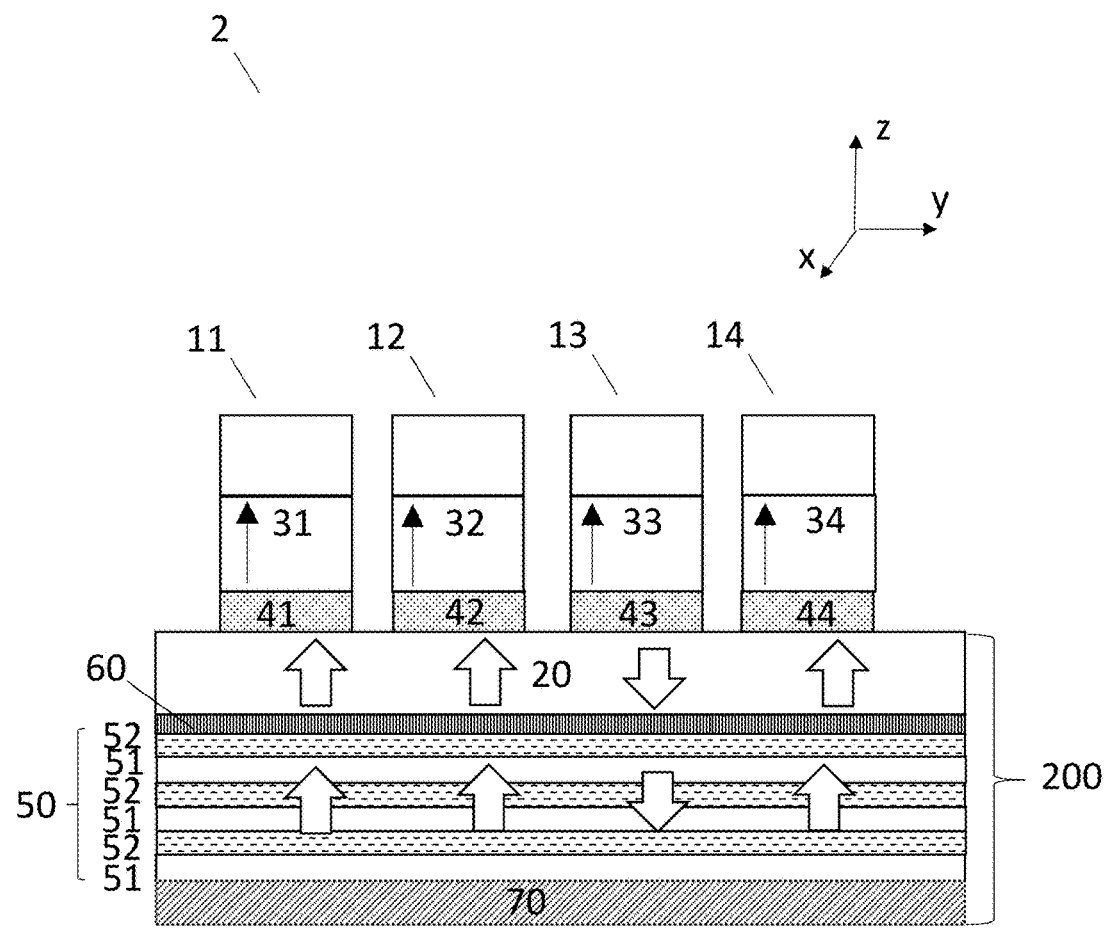
FIG. 5 shows a schematic cross-sectional side view of a majority gate device according to alternative embodiments of the present disclosure.

FIGS. 3-5 shows schematically a majority gate device 2 comprising three separate input zones 11, 12, 13 and one output zones 14. The zones may be formed as pillars. In the illustrated embodiment, the pillars may have a cylindrical shape having circular cross-sections, however, the shape is not limited thereto. The (input and output) pillars are separated and positioned at a distance from one another. The zones are thus distinct from one another. For example, the pillars may be positioned in a cross-bar, similar to the example device described above with respect to FIG. 1. While three input zones and one output zone is depicted in the illustrated embodiment, it will be appreciated that the number of zones (pillars) may vary and is thus not limited to three input zones (pillars) and/or one output zone (pillars). According to embodiments, the majority gate device comprises at least two input zones and one output zone, e.g., three input zones and one output zone. The output pillar of the STMG assumes the same logical state ("0" or "1") as the majority of the input pillars. The magnetization of the common free layer is switched by spin torque to a state corresponding to the majority magnetization of the input pillars, which is determined by the majority current passing through the input pillars.

Although the input and output zones are at a distance from one another, according to embodiments they may share different layers or have different layers in common, as will be explained further.

Each zone (i.e. each input zone 11, 12, 13 and output zone 14) comprises a non-magnetic layer 40 (FIGS. 6A-6C), 41, 42, 43, 44 which is interposed between a ferromagnetic soft layer, referred to herein as a free layer stack 200 and a ferromagnetic hard layer 30 (FIGS. 6A-6C), 31, 32, 33, 34 (comprising typically a fixed layer and a pinning layer—not shown). Each of the combinations of the free layer stack 200, the non-magnetic layer 40, 41, 42, 43, 44 and the fixed layer 30, 31, 32, 33, 34 is referred to herein as a magnetic tunnel junction (MTJ). Thus, in the illustrated embodiment, each of the input zones 11, 12, 13 and the output zone 14 comprises an MTJ. According to embodiments, top-pinned MTJs with perpendicular magnetic anisotropy (PMA) may be advantageous for having improved scalability of the PMA technology for smaller feature sizes. For top-pinned MTJs having PMA, the free layer stack 200 of the MTJ is formed at the bottom layer of the MTJ, thus below the non-magnetic layer 40, 41, 42, 43, 44 at the bottom electrode side, whereas the hard layer 30, 31, 32, 33, 34 of the MTJ is formed above the non-magnetic layer 40, 41, 42, 43, 44, at the top electrode side.

In the embodiments illustrated with respect to FIGS. 3 and 4, each of the input zones 11, 12, 13 and the output zone 14 has a respective one of a separated magnetic layer 21, 22, 23 and 24. In contrast, in the embodiment illustrated with respect to FIG. 5, the input zones 11, 12, 13 and the output zone 14 has a common magnetic layer 20.

In operation, the direction of magnetization of the hard layer 30, 31, 32, 33, 34 is fixed, whereas the direction of magnetization of the free layer stack 200 can be changed by passing a spin-polarized drive current therethrough, where the drive current is spin-polarized by the magnetization of the hard layer 30, 31, 32, 33, 34. When the direction of magnetization of the hard layer 30, 31, 32, 33, 34 and the free layer stack 200 are parallel, the MTJ element is in low resistance. Conversely, when the direction of magnetization of the hard layer 30, 31, 32, 33, 34 and the free layer stack 200 are antiparallel, the MTJ element is in high resistance.

The non-magnetic layer 40, 41, 42, 43 can also be referred to herein and in the relevant industry as a tunneling layer, a tunneling spacer layer or a barrier layer. According to various embodiments, the non-magnetic layer 40, 41, 42, 43 comprises or is formed of MgO. However, other embodiments of the non-magnetic layer 40, 41, 42, 43 are possible, and other insulating materials such as $Al_xO_y$, $Ti_xO_y$, $Zn_xO_y$, (0<x,y) may be used for the non-magnetic layer 40, 41, 42, 43.

According to embodiments, the hard layer 30, 31, 32, 33, 34 may comprise multiple layers such, as for example, a fixed ferromagnetic layer on a pinning layer (not shown). Each input 11, 12, 13 and output zone 14 comprises a hard layer 31, 32, 33, 34 which is distinct between the different zones. Otherwise said the hard layer 31, 32, 33, 34 is not common or shared between the different zones. From the manufacturing process it will become clear that the hard layer of each zone may be made of the same material and may thus be a shared layer in an intermediate device, but not in the final device according to the disclosure. However during the manufacturing of the STMG device, the hard layer will be patterned to thereby form the different input and output zones (see further).

Figure 6A:
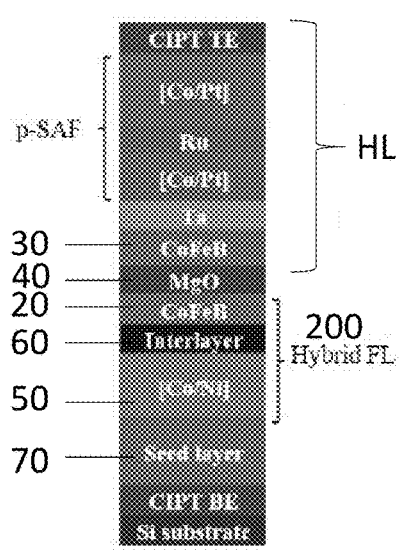
FIGS. 6A and 6C show magnetic stacks comprising a (hybrid) free layer according to embodiments.
Figure 6B:
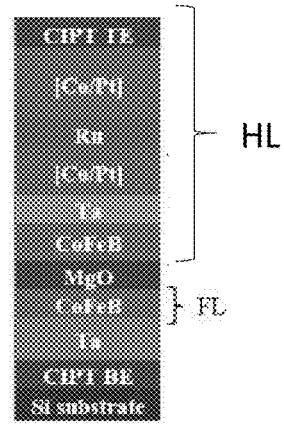
FIG. 6B shows a conventional magnetic stack comprising a free layer.
Figure 6C:
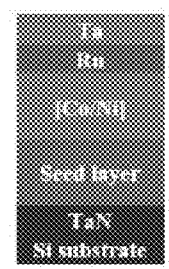

Referring to FIGS. 6A-6C, according to various embodiments the free layer stack 200 of the majority gate device 2 may be a stack of layer including a seed layer 70, on the seed layer a bulk PMA layer 50 and on the bulk PMA layer a ferromagnetic layer 20, the ferromagnetic layer being in contact with the non-magnetic layer 40.

At least the seed layer 70 and the bulk PMA layer 50 are common or shared between the different or distinct input and output zones. These layers remain unpatterned, which means they are not patterned to form pillars and thus also not etched to form the pillars. This is shown for example in FIG. 3 wherein the seed layer 70 and thereon the bulk PMA layer 50 are both common and shared for each input zone 11, 12, 13 and the output zone 14. The free layer stack 200 may also be referred to as a hybrid free layer further in the description.

In operation, the reversal of the magnetization of the free layer stack 200 at the input zones 11, 12, 13 occurs via spin torque transfer (spin polarized current) acting on the magnetic layer 20 which is part of the free layer stack 200. Due to ferromagnetic coupling with the underlying bulk PMA layer, the switching of the magnetization of the free layer stack 200 will be established and the magnetic domain will propagate via the common/shared bulk PMA layer 50 towards the output zone 14.

According to embodiments, the majority gate device 2 may further comprise an interface layer between the bulk PMA layer 50 and the magnetic layer 20. In the embodiment illustrated with respect to FIG. 3, each of the input zones 11, 12, 13 and the output zone 14 has a respective one of a separated interface layer 61, 62, 63 and 64. In contrast, in the embodiment illustrated with respect to FIGS. 4 and 5, the input zones 11, 12, 13 and the output zone 14 has a common interface layer 60. The interface layer 60 (FIGS. 4 and 5) and the interface layers 61, 62, 63, 64, which may also be referred to as an interlayer (IL) or interlayers (ILs), serves as crystallization enhancement layer to ensure crystallization of the ferromagnetic layer (20) in a desired texture to obtain PMA and TMR. When the non-magnetic layer 40, 41, 42, 43, 44 is formed of MgO, the orientation of the ferromagnetic material such as CoFeB is preferably a (001) orientation. The IL also is configured to couple the bulk PMA layer 50 with the magnetic layer 20 through ferromagnetic interlayer exchange coupling. According to embodiments, the interface layer 60 may comprise a material chosen from Ta, Mo, W, V, Ru or an alloy chosen from CoFeBX, CoX, FeX, FeCoX, where X can be any of Ta, Mo, W, V, Ru.

According to embodiments, the bulk PMA layer 50 may comprise a multilayer, or may comprise a bulk PMA material or may comprise both.

According to embodiments the bulk PMA multilayer may comprise a repetition of two or more times of a bilayer, the bilayer comprising a first layer and a second layer. The first layer may comprise any of FeB, Fe, Co, CoFe and the second layer may comprise any of Ni, Tb, CoTb, TbFe, Pd, or Pt. The thickness of the first layer and the thickness of the second layer may be in the range of 0.2 nm to 2 nm. An example of a bulk PMA multilayer may be [Co(0.3 nm)/Ni (0.6 nm))]$_4$ which is a Co/Ni bilayer repeated 4 times, where the Co layer has a thickness of 0.3 nm and the Ni layer has a thickness of 0.6 nm.

The PMA of the multilayer may be tuned by modifying the parameters of the bulk PMA multilayer such as by tuning the bilayer thickness, by tuning the number of repetition of the bilayer, by tuning the seed layer material and/or seed layer thickness. It is an advantage that the bulk PMA layer is tunable and the PMA may be equally tuned thereby enabling a fast switching and/or low power operation.

According to embodiments, the bulk PMA layer may comprise a bulk PMA material such as a $Mn_xA_y$ alloy, where A is chosen from Al, Ga or Ge (with x,y>0) or alloys formed thereof. An alternative bulk PMA material may be FePt, CoPt, TbCoFe and alloys formed thereof. The PMA of the alloy may be tuned by modifying the parameters of the bulk PMA material such as the stoichiometric content of the PMA bulk material, for exampling by tuning the stoichiometric content of Ga or Ge with respect to Mn.

Further in the description experimental results are presented for an MTJ stack according to the present disclosure for MRAM applications. As PMA for STMG device is not as stringent as PMA for an MRAM device for high density memory applications these results also prove that a majority gate device according to the present disclosure will have excellent device properties (more relaxed but sufficient PMA and TMR). The main differences and advantages of the majority gate device according to the present disclosure will now be described in more detail.

Majority gate devices disclosed herein may be configured for performing logical operations. In these applications, the demand for thermal stability of the free layer (which is linked with PMA and TMR properties) may be less stringent compared to applications of MTJs in non-volatile memory devices such as magnetic random access memory (MRAM). It has been surprisingly found by the inventors that the hybrid free layer according to the present disclosure is an excellent candidate for a majority gate device. It is an advantage of the majority gate device according to the present disclosure and more specifically of the hybrid free layer stack 200 according to embodiments that it offers a lot of freedom in tuning to a lower PMA and/or TMR value (as required for an STMG device). This is beneficial for the power consumption and switching speed trade-off. Tuning of the hybrid free layer stack 200, which is further described below, may include one or more of tuning the thickness of hybrid free layer, tuning the material properties of the hybrid free layer, more specifically tuning the thickness of the bulk PMA layer and/or magnetic layer and/or interface layer and/or seed layer, tuning the material properties of the bulk PMA layer and/or magnetic layer and/or interface layer and/or seed layer, or tuning the amount of layers of the bulk PMA multilayer and/or tuning the material and/or thickness of the first and/or second layer of the multilayer of a combination thereof, according to embodiments.

It is moreover an advantage of the majority gate device according to the present disclosure that the complex and challenging patterning/etch process flow which is detrimental for an MRAM stack offers a solution for a majority gate device according to the present disclosure as less stringent magnetic properties (lower PMA) are required. Even if the free layer stack 200 according to embodiments of the present disclosure would be damaged due to patterning of the pillar it would not jeopardize the functionality or properties of the majority gate device.

In the following, according to embodiments, a method for manufacturing a majority gate device is disclosed.

The input zones 11, 12, 13 and the output zone 14 of the majority gate device 2 may have different layers in common or otherwise said may share different layers. At least the hard layer 31, 32, 33, 34 should be distinct for the different (input and output) zones as this layer is conductive and cannot cause any electrical shorting between the zones or pillars. This is achieved by first providing a stack of layers 3 comprising all the necessary layers for the majority gate device 2 and thereafter form the input and output zones or pillars by patterning one or more layers of the stack.

Figure 11:
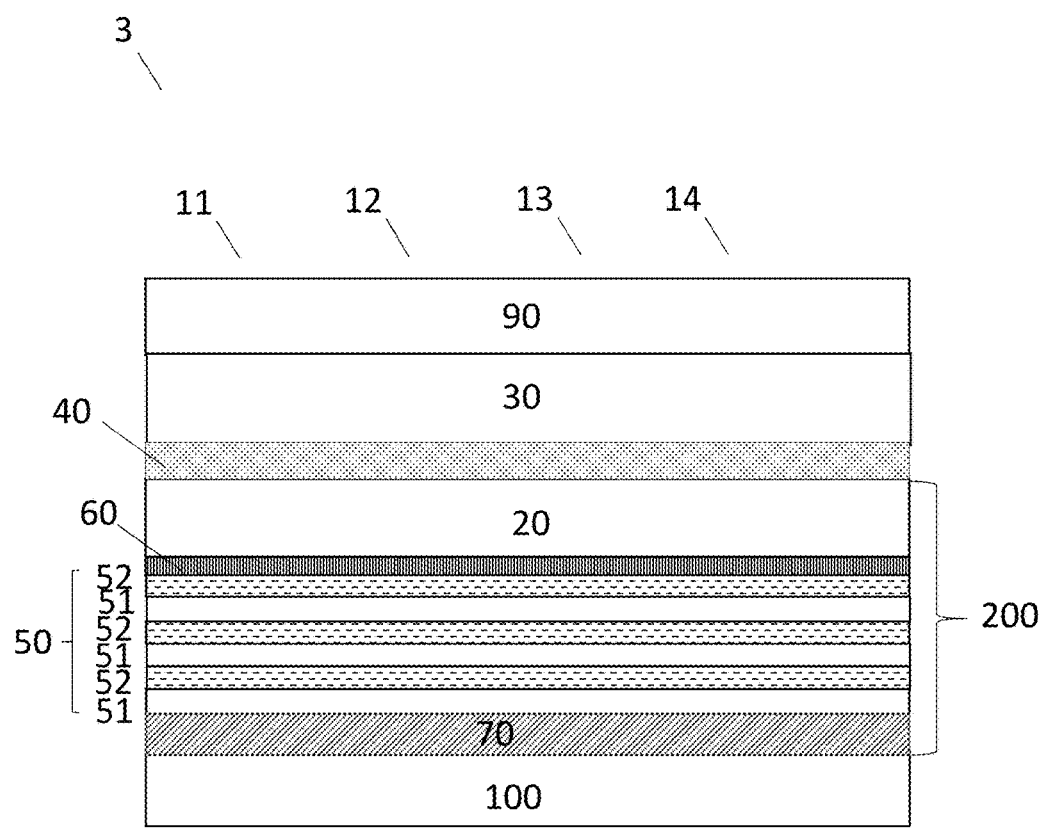
FIG. 11 shows a schematic cross-sectional view of an intermediate structure including a stack of layers for fabricating a majority gate device, according to embodiments of the present disclosure.

In FIG. 11 a stack of layers 3 according to embodiments is shown for manufacturing a majority gate device. A seed layer 70 is provided on a bottom electrode 100. On the seed layer a bulk PMA layer 50 may be provided, which is in this example is stack of alternating layers 51 and 52. On the bulk PMA layer an optional interface layer 60 may be provided. On the optional interface layer 60 a ferromagnetic layer is provided. The common free layer stack 200 of the majority gate device is formed by this sub stack of layers. On the free layer stack 200, a non-magnetic layer 40 is provided. Thereupon a hard layer 30 is provided which may further comprise different layers such as a synthetic anti-ferromagnet (SAF) structure (as, for example, shown in FIG. 6A). On top of the hard layer 30 a top electrode 90 may be provided. The different layers may be provided by deposition techniques well known for a person skilled in the art, such as sputtering and epitaxial growth.

From the stack of layers 3, a set of input zones 11, 12, 13 and an output zone 14 are formed by patterning to form distinct pillars (input and output).

According to embodiments, the patterning step (which may involve one or more patterning steps), which comprises etching, can stop at different levels in the stack of layers.

Figure 12:
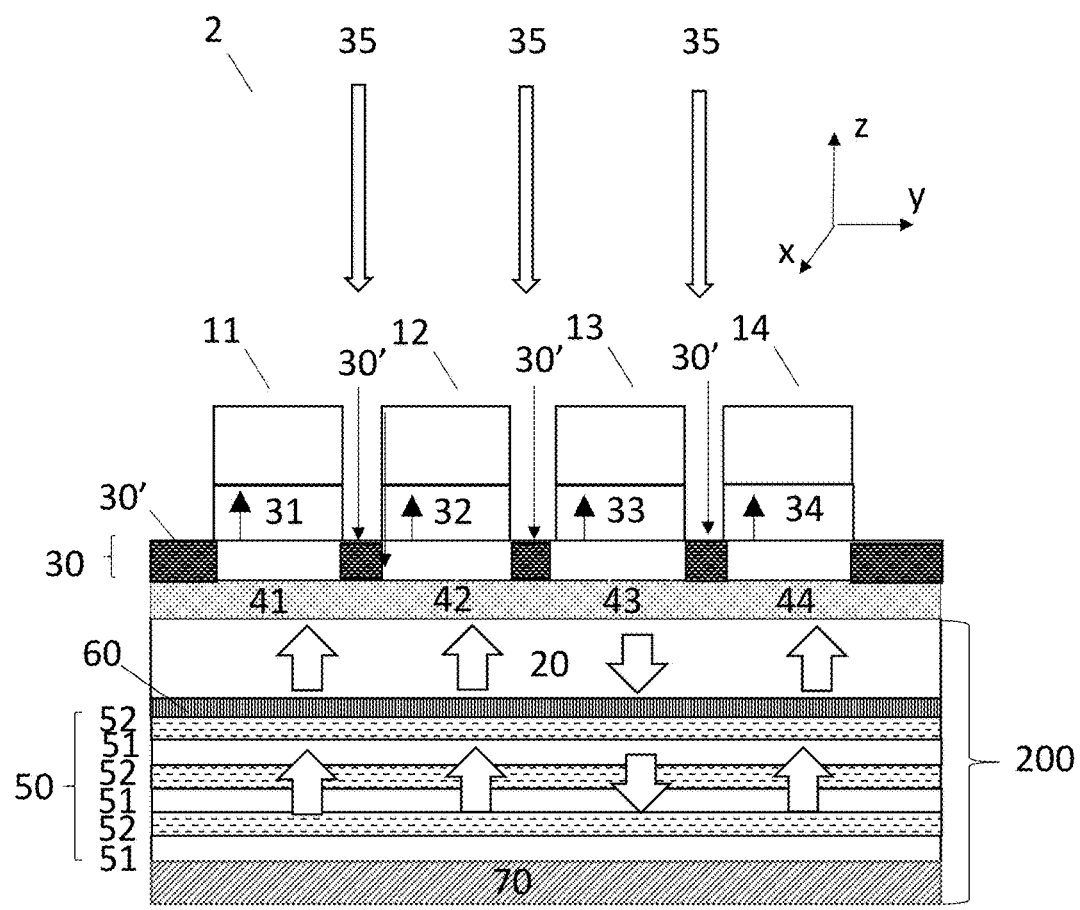
FIGS. 12-13 show schematic side views of intermediate structures at different stages of fabrication of a majority gate device, according to alternative embodiments of the present disclosure.

Referring to FIG. 12, according to embodiments, the etch may stop prior to the non-magnetic layer 40, thus in the hard layer 30 thereby patterning a top part of the hard layer 30 into distinct hard layers 31, 32, 33, 34 and leaving a remaining lower part of the hard layer unpatterned 30. According to embodiments, an additional treatment 35 (such as for example an oxygen treatment) may be performed so that the remaining non-patterned part of the hard layer 30' in between the pillars is converted from a magnetic layer to an insulating non-magnetic layer as shown in FIG. 12.

Figure 13:
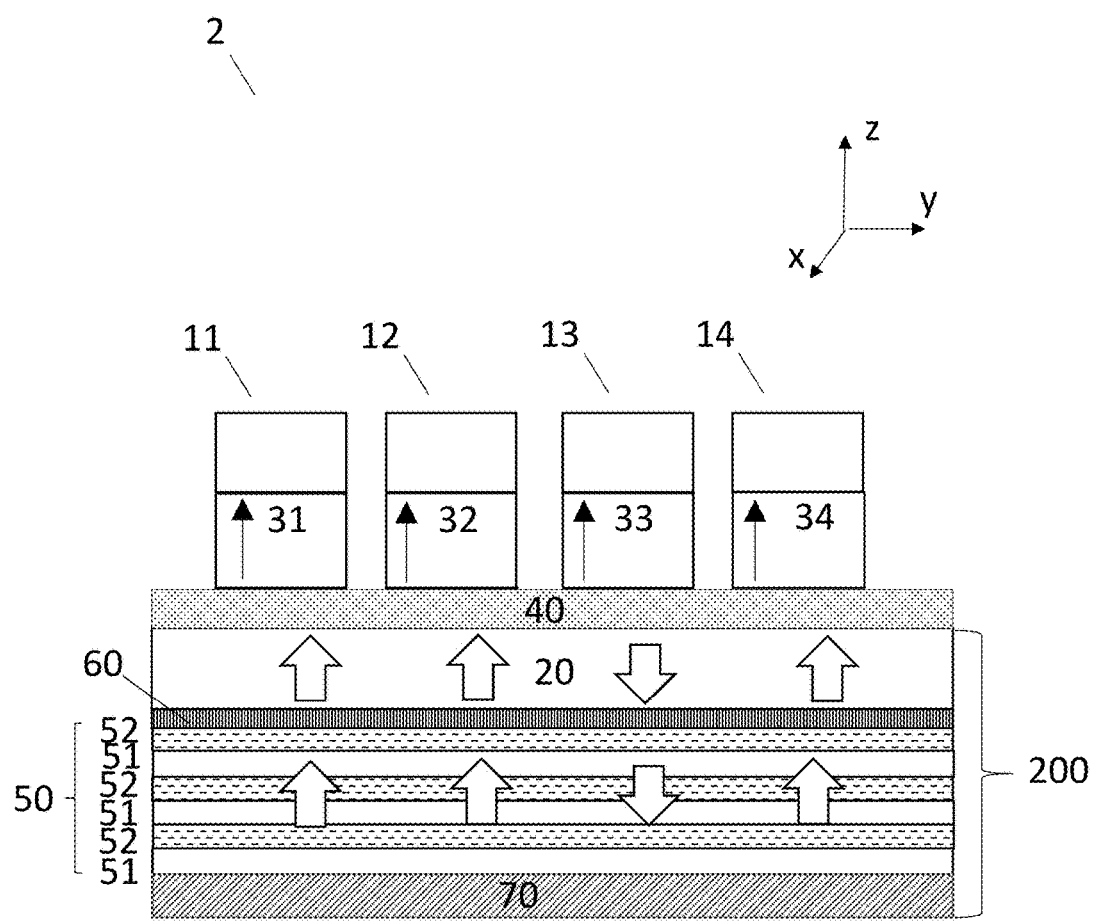

Referring to FIG. 13, according to alternative embodiments, the etch may stop on the non-magnetic layer 40, thereby patterning the complete hard layer 30 into distinct hard layers 31, 32, 33, 34 as shown in FIG. 13. According to these embodiments the free layer stack 200 is shared for all input and output zones.

According to alternative embodiments, the etch may stop on the bulk PMA layer 50 as shown in FIG. 3 or if present on the optional interface layer 60 as shown in FIG. 4. According to these embodiments the free layer stack 200 is not completely shared for all input and output zones but only the seed layer, the bulk PMA layer and if present optionally the interface layer 60 are common for all the input and output zones.

According to alternative embodiments, the etch process may stop on the magnetic layer 20 as shown in FIG. 5. In this case the hard layer 30 and non-magnetic layer 41, 42, 43, 44 are patterned and defining the different input and output pillars.

At least the seed layer and the bulk PMA layer should be shared between the distinct input and output zones, otherwise said, these layers should remain unpatterned as the bulk PMA layer serves as the common ferromagnetic layer through which the input and output pillars are connected. It can even be tolerated that part of the bulk PMA layer is etched or damaged, as long as the remaining part still has sufficient PMA to serve as common free PMA layer. Since the layer used is a bulk PMA material, removal of part of it will not destroy the PMA of the remaining part.

It is an advantage of the majority gate device 2 according to the present disclosure that it offers great flexibility regarding the shared (unpatterned) layers between the distinct input and output zones.

It is an advantage of the method for manufacturing the majority gate device that a lot of flexibility is offered regarding patterning of the input zones and output zone (or pillars). The input zones (pillars) and output zone may be patterned by selectively etching towards the bulk PMA layer or the interface layer or the magnetic layer of even the hard layer.

As the bulk PMA layer is the critical layer for propagating the majority magnetization of the input zones to the output zone, all the layers on top of the bulk PMA layer may be patterned and thus the disadvantages as known from prior art majority gate devices (i.e. the problems of etching the non-magnetic layer and electrical shorting between the different zones) are removed.

Figure 2:
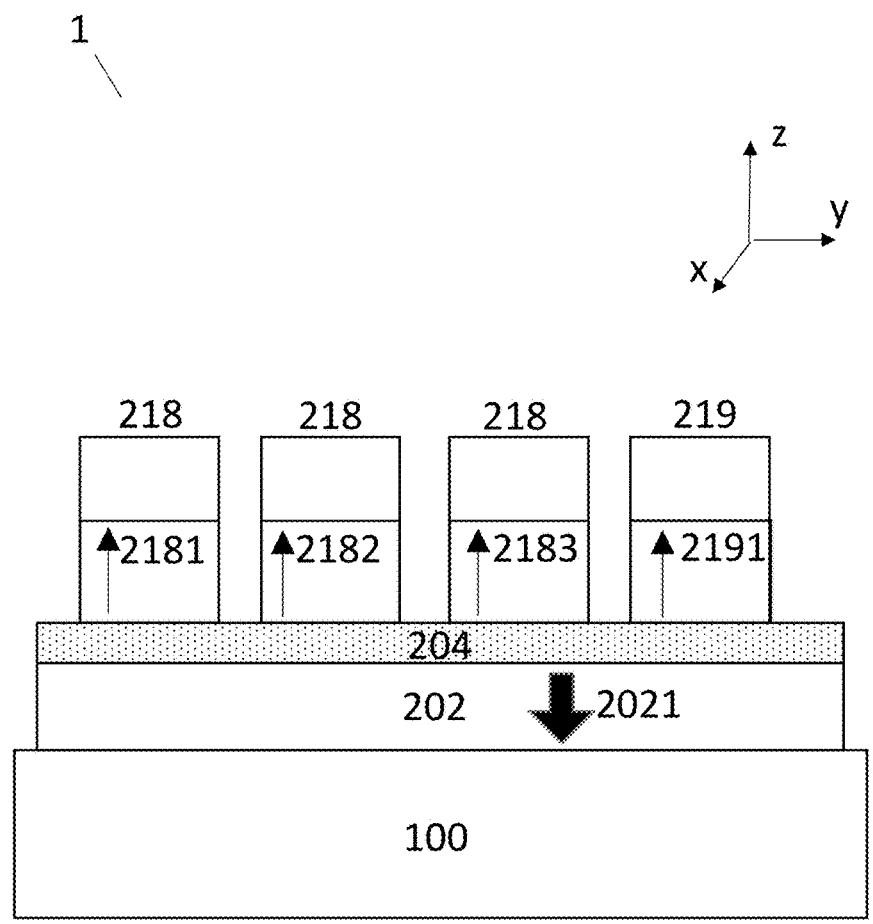
FIG. 2 shows a schematic cross-sectional side view of the example STMG device of FIG. 1.

In a prior art majority gate device 1 as shown in FIG. 2, the etch process requires to stop selectively on the non-magnetic layer since no magnetic conductive residue is tolerated on top of the non-magnetic layer as this may induce electrical shortening between the distinct input zones and/or output zone. The fabrication process of such a prior art MTJ element typically involves the deposition of a stack of layers (hard layer, tunneling barrier layer and free layer) followed by patterning the stack of layers. Patterning of an MTJ element is one of the most critical aspects of fabrication in MTJ technology, as this involves etching portions of the stack of layers whereby almost all the layers used in such a stack form nonvolatile by-products. The etching process may thus leave residues on the patterned layers which residues can cause, for example, electrical shorting, corrosion and degradation of the MTJ element. Their deposition on the sidewalls of the MTJ element may be detrimental to the memory device performance. As the non-magnetic layer is thin (approximately 1 nm) etch species penetrate easily through the non-magnetic layer and damage the interface between the underlying common free layer and the non-magnetic layer thereby causing a loss of PMA and TMR.

Experimental Results

Spin-transfer-torque magnetic random access memory (STT-MRAM) with perpendicular magnetic anisotropy (PMA) has attracted a great deal of attention for the replacement of conventional memories, like dynamic random access memory (DRAM) and embedded static random access memory (SRAM). The advantages of perpendicular STT-MRAM lie in its non-volatility, short access time, low switching current and potential scalability. The key components of perpendicular STT-MRAM include the magnetic tunnel junctions (MTJs) with perpendicular magnetic easy axis. To meet the requirements mentioned above, free layers (FL) in perpendicular MTJs should have a low damping constant for low switching current and a large effective magnetic anisotropy energy per unit area ($K^{eff}_U \times t$) for high thermal stability ($\Delta$). CoFeB/MgO based free layers are commonly used. $K^{eff}_U \times t$ as high as 0.5 erg/cm$^2$ and damping constant values as low as 0.004 are reported, which makes it attractive for memory applications with critical dimensions down to 30 nm. However, since its perpendicular magnetic anisotropy is interface mediated, the CoFeB thickness cannot be increased further. As such, $K^{eff}_U \times t$ of the CoFeB/MgO based free layer fails to increase above 1.0 erg/cm$^2$ even for free layer where two MgO/CoFeB interfaces are applied, so-called dual MgO free layers. These free layers will not satisfy the requests for high thermal stability as the device dimensions reduce to 20 nm and below for bit density increase. A number of new materials with bulk PMA have then been explored as alternative FL, like [Co/X] (X=Pt, Ni, Pd) multilayers (MLs), L1$_0$-FePt[9] and MnZ (Z=Ga, Ge) alloys. Mn-based Heusler alloys are highly challenging since they require accurate composition control during epitaxial growth to ensure the required crystal structure that induces the large PMA. So far, MTJs with Mn$_3$Ge show very low TMR (<25%) 12,13. For [Co/Pt] MLs, it was demonstrated with [Co/Pt] as part of FL in a MgO-barrier perpendicular MTJ with a high $K^{eff}_U \times t$ value, but Pt in [Co/Pt] FL exerts large spin-orbit coupling to electrons and hence increases the damping constant, which leads to large switching current. FePt alloy is excluded as well for the same reason above. Besides [Co/Pt], [Co/Ni] have been researched and considered as a promising alternative FL materials due to its combination of large spin polarization, relatively low damping and high PMA. [Co/Ni] has been used as electrodes in amorphous Al$_2$O$_3$-barrier MTJs, yielding TMR values<10%. [Co/Ni] has been grown in direct contact with MgO barrier to form a spin valve, but no magnetotransport property was reported. In short, how to increase the FL PMA in an MgO-barrier MTJ without compromising TMR remains unsolved. We demonstrate for the first time a 165% TMR MTJ stack with a $K^{eff}_U \times t$ of 1.25 erg/cm$^2$ by using a [Co/Ni]/CoFeB hybrid FL design. We report on its magnetic properties and switching behavior. The impact of the seed layers below the [Co/Ni] is discussed. Proper seed selection is crucial to enable [Co/Ni] for high thermal stability free layer applications.

Top pinned (TP) perpendicular MTJs with [Co/Pt] MLs as perpendicular synthetic antiferromagnet (p-SAF) were in-situ deposited on smoothened TaN-based bottom electrodes (BE) at room temperature by physical vapor deposition in a Canon Anelva EC7800 tool. The stacks are schematically shown in FIGS. 6A-6C. MTJ stacks with a traditional CoFeB FL as shown in FIG. 6B were deposited for reference. All wafers with full MTJ stack deposition received annealing in a 1T magnetic field at 300 degrees Celsius for 30 min. For the seed layer study, [Co/Ni] stacks [Ni(6 Å)/Co(3 Å)]4 on Hf (1 nm)/NiCr (2 nm) and Pt (3 nm) seeds as shown in FIG. 6C, were deposited at room temperature in the same tool and then annealed at various temperatures for 30 min in N$_2$ in a rapid thermal annealing (RTA) set-up for comparison. The magnetic properties of [Co/Ni], the full MTJ stack, and hybrid FL (FIG. 6A) were characterized with a Microsense vibrating sample magnetometer (VSM). The saturation magnetization per unit area (M$_s$) of the hybrid FL was derived from perpendicular minor loop of hybrid FL only, while its anisotropy field (H$_K$) is calculated by comparing in-plane hysteresis loop of the full stack with that of reference stack. TMR and RA measurements were done via current-in-plane tunneling method (CIPT) using a Capres set-up.

Figure 7A:
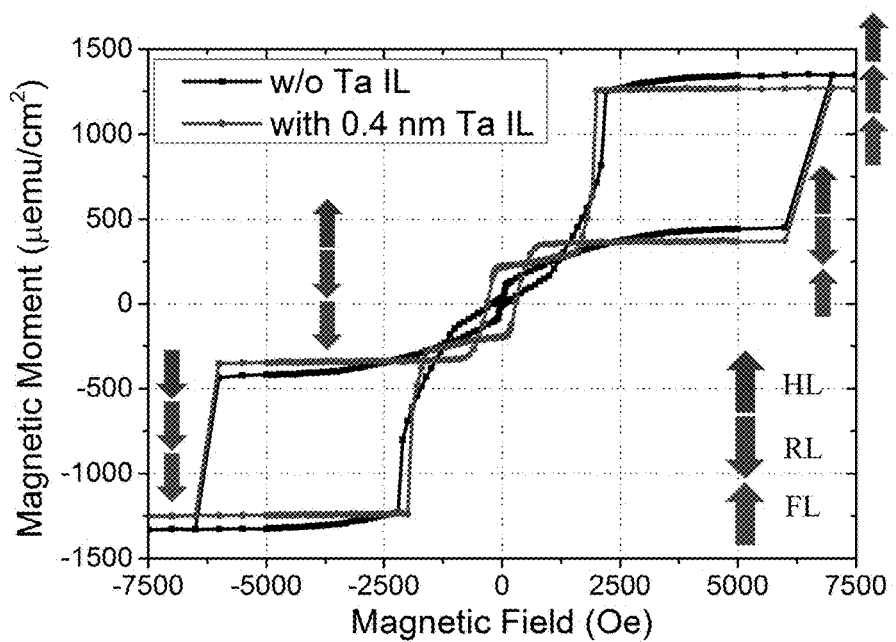
FIGS. 7A-B and FIG. 8 show experimental results of the magnetic moment for a magnetic stack according to embodiments of the present disclosure.
Figure 7B:
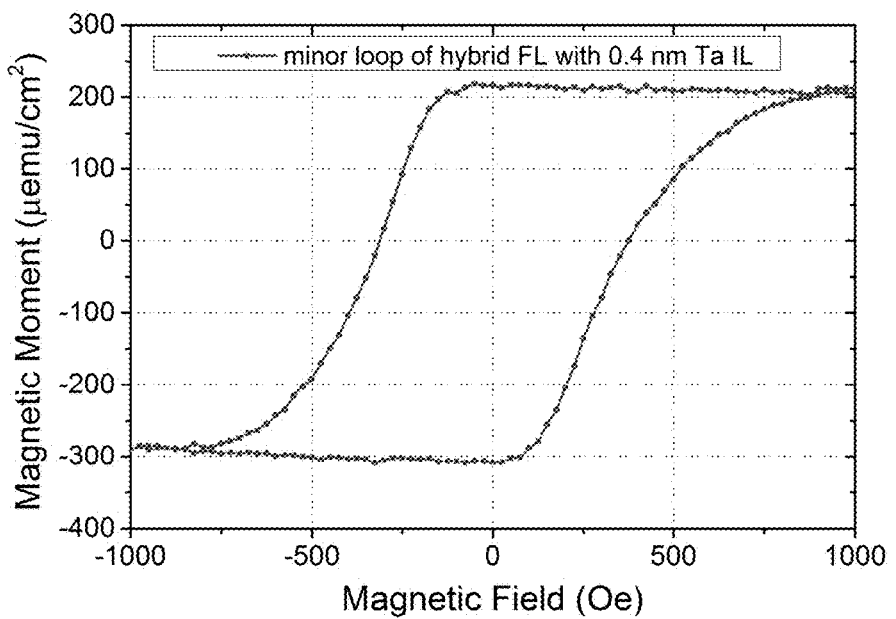

Integrating [Co/Ni] into an MgO-barrier MTJ is non-trivial, since its FCC (111) crystal structure is incompatible with MgO(001) in the electron band matching. As a result, CoFeB should be kept at the interface with MgO to enable high TMR. That makes the use of an interlayer (IL) essential, since on the one hand it needs to decouple the crystallization of CoFeB from the fcc(111) of the [Co/Ni] while on the other hand it needs to couple them ferromagnetically so they behave as one FL. Indeed, when no Ta IL is present in between the [Co/Ni] and the CoFeB, an in-plane component in the free layers magnetization is observed (FIG. 7A), which we attribute to inappropriate crystallization of the CoFeB. Note that also the reference layer loses PMA, indicating that even the MgO crystallization is affected by the underlying [Co/Ni]. After inserting Ta layer between [Co/Ni] and CoFeB, the MTJ stack shows PMA and clear switching of different functional layers, as shown in FIG. 7A. One-step switching in the minor loops of the FL in FIG. 7B also proves that CoFeB and [Co/Ni] are ferromagnetically coupled and act as a single FL for 0.4 nm Ta IL thicknesses, which is thick enough to separate CoFeB from [Co/Ni] structurally while couple them ferromagnetically. The optimal Ta thickness range is in agreement with earlier reported values for CoFeB/Ta/[Co/Pt] systems. The hybrid FL with 0.4 nm Ta IL in FIG. 7B shows a large PMA, whose $K^{eff}_U \times t$ is calculated as 0.76 erg/cm$^2$. Unfortunately, the switching of hybrid FL grown on NiCr seed is non-sharp and a large coercive field (H$_c$~400Oe) is observed (see FIG. 7B).

Figure 8:
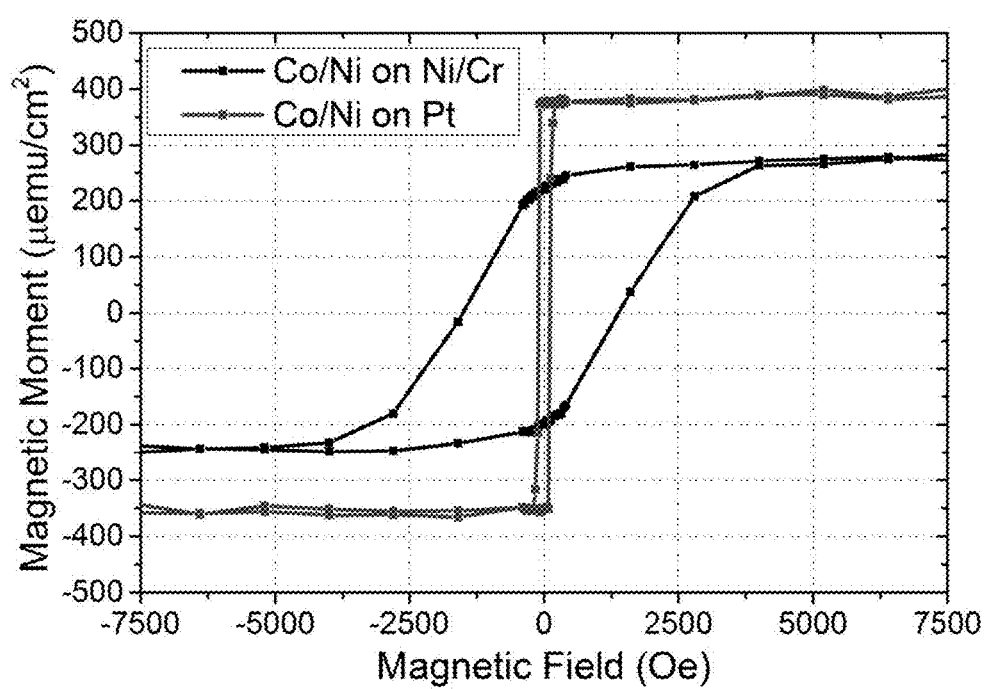
Figure 9:
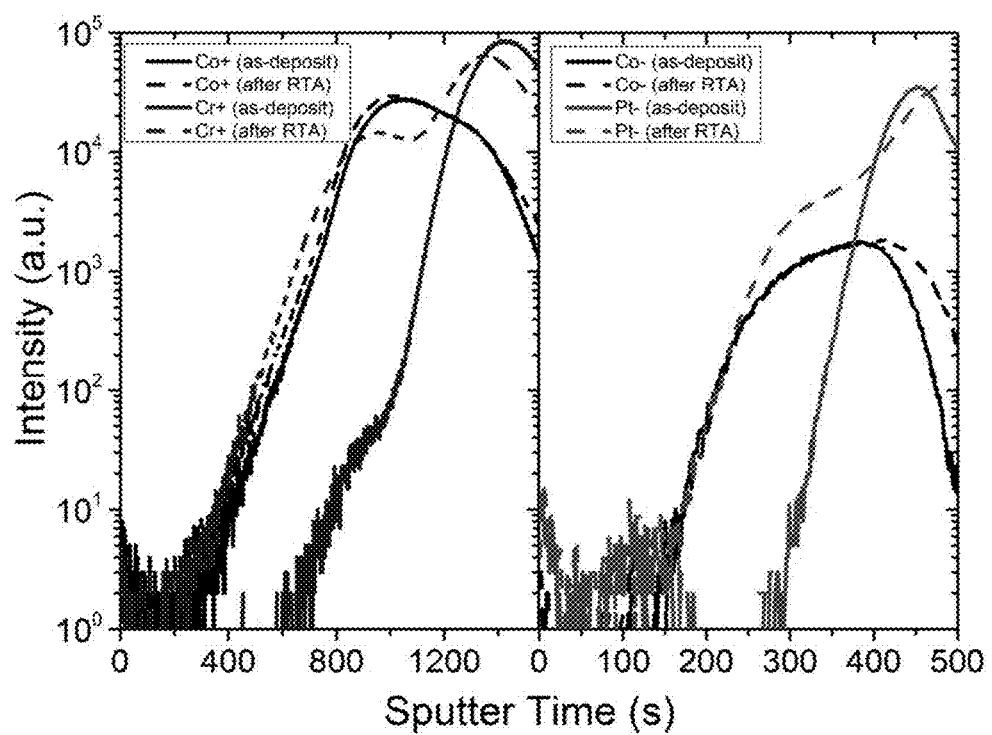
FIG. 9 shows experimental TOF-SIMS results for a magnetic stack according to embodiments of the present disclosure.

[Co/Ni] on NiCr seeds were earlier reported as pinned layer in bottom-pinned MTJs, where large coercivity, i.e. hard magnetic behavior, is desired. In contrast, for the FL application, soft magnetic behavior and high squareness is required to ensure a low switching current and a narrow switching distribution on device level. An alternative seed with a lattice almost matching (9%) with [Co/Ni] is Pt, which can be studied by depositing [Co/Ni] stack as shown in FIG. 6C. FIG. 8 shows the perpendicular hysteresis loops of [Co/Ni] deposited on NiCr and Pt seed, respectively. As deposited [Co/Ni] show PMA on both seed layers and they have similar M$_s$ (data not shown). After annealing, M$_s$ decreases and coercivity increases for the NiCr seed, whereas Ms and coercivity remain constant for the Pt seed. [Co/Ni] on NiCr seed has large coercivity (H$_c$~2000Oe) yet its switching is bow-tie like with lower squareness than MLs on Pt. The reason for the large coercivity in the case of the NiCr seed is the formation of a Co—Ni—Cr alloy. The diffusion of non-magnetic materials (Cr) into [Co/Ni] can affect the saturation magnetization due to the formation of non-magnetic phase (Co$_{62.5}$—Ni$_{30}$—Cr$_{7.5}$ alloy is known as a hard magnet with smaller Ms and larger coercivity than its Co—Ni equivalent31). Indeed, the depth profile of Cr before and after annealing given by time-of-flight secondary ion mass spectrometry (ToF-SIMS) indicates that a significant amount of Cr from the NiCr seed diffuses into the [Co/Ni]

after annealing (see FIG. 9). In the case of the Pt seed, diffusion into [Co/Ni] also takes place, but is limited to a fraction of the seed and Co—Ni—Pt alloys are not known to form a hard magnetic material. Furthermore, the PMA of [Co/Ni] on Pt seed is influenced by the specific material, Co or Ni, in direct contact with the Pt seed. That indicates that after annealing the interface between the [Co/Ni] and Pt is maintained and limited diffusion has taken place. Indeed, a $K^{eff}_U$ of $2:2\times10^6$ erg/cm$^3$ was found for the Pt/[Co/Ni] case whereas only a $K^{eff}_U$ of $1.5\times10^6$ erg/cm$^3$ was found for the Pt/[Ni/Co] stack. In the Pt/[Co/Ni] case, the [Co/Ni] benefits from the extra Pt/Co interface which is known to induce a strong PMA in the Co.

Figure 10:
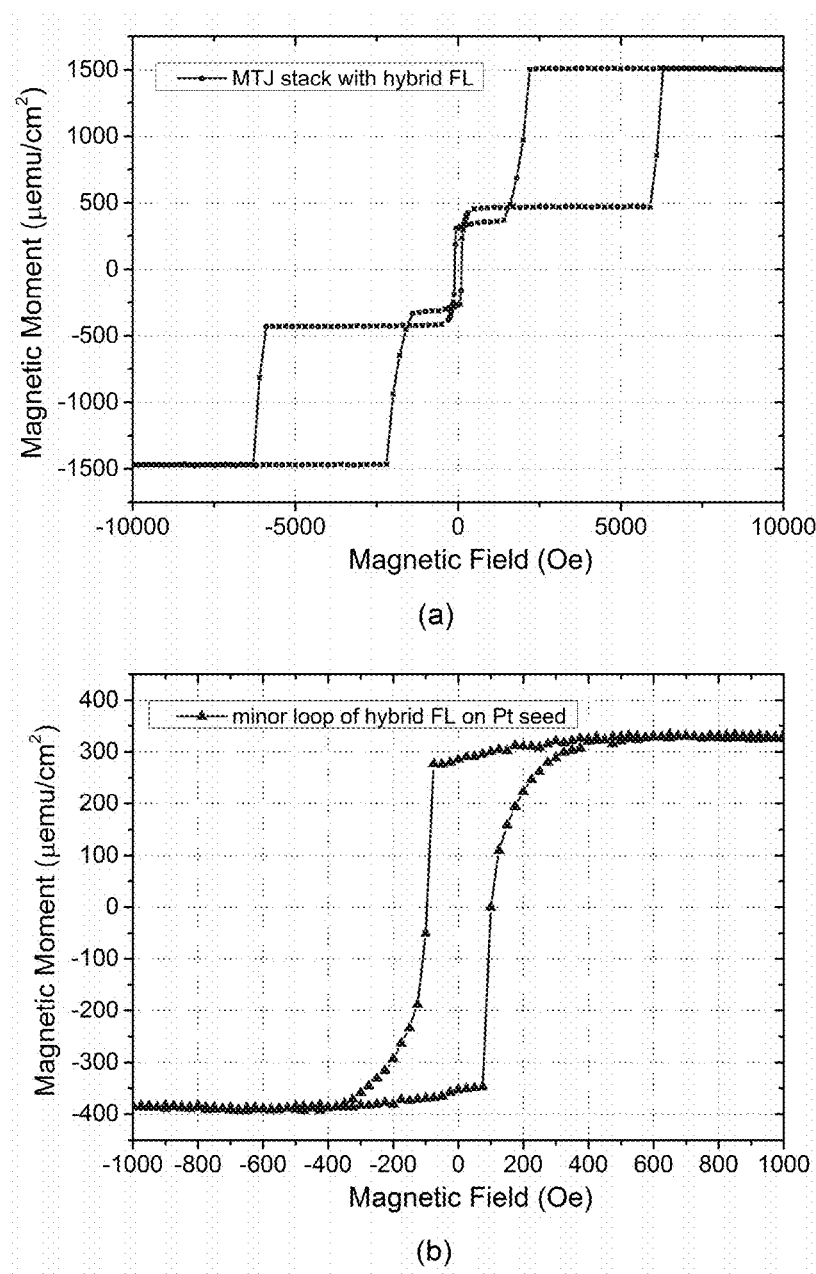
FIG. 10 show experimental results of the magnetic moment for a magnetic stack according to embodiments of the present disclosure.

When replacing the NiCr seed with a Pt seed and starting the [Co/Ni] deposition sequence with Co enables a high PMA hybrid FL with soft magnetic and high squareness switching behavior after annealing. When integrated in the TP MTJ stack, the switching of hybrid FL with Pt seed layer shows low coercivity ($H_c$<100Oe) and high squareness, as illustrated in FIG. 10. Table I compares the properties of the TP MTJ stack with the [Co/Ni]—CoFeB hybrid FL on a Pt seed (FIG. 6(a)) to the properties of an TP MTJ stack with a traditional CoFeB FL (see FIG. 6(b)).

TABLE 1

Comparison of magnetotransport properties between MTJ stacks with traditional and hybrid FL.

| MTJ | TMR % | RA Ω · µm² | FL $K_U^{eff} \times t$ erg/cm² |
|---|---|---|---|
| single CoFeB | 159 | 8.1 | 0.40 |
| hybrid FL | 165 | 7.0 | 1.25 |

In both cases the CoFeB thickness was 1 nm. $K^{eff}_U \times t$ of the hybrid FL reaches 1.25 erg/cm² without penalty on TMR and RA. TMR values of 165% are obtained. Values are even slightly higher than the reference stack indicating that the [Co/Ni] increases the polarization efficiency of the free layer. If more Co and Ni sublayers are used, $K^{eff}_U \times t$ can easily reach values as high as 2.0 erg/cm², yet there a decrease in TMR due to increased roughness can be expected and further optimization of the deposition process might be required. In the macrospin model, a $K^{eff}_U \times t$ value of 1.25 erg/cm² provides at room temperature a thermal stability factor larger than 60 for devices down to 16 nm in diameter, which makes the hybrid free layer a viable route for high density MRAM applications.

In conclusion, high TMR perpendicular MTJs with a [Co/Ni]—CoFeB hybrid free layer design are demonstrated. When deposited on a NiCr seed, the hybrid FL shows large coercivity and low squareness, which is attributed to the diffusion of Cr in the [Co/Ni] multilayers during annealing. Low coercivity and high squareness is achieved when a Pt seed is used. Integrated in high TMR TP MTJ stacks, a high thermal stability ($K^{eff}_U \times t$ of 1.25 erg/cm²) FL is obtained for a 165% TMR stack. The hybrid free layer design enables the high thermal stability required for sub 20 nm STT-MRAM stacks.

The foregoing is illustrative of example embodiments and is not to be construed as limiting thereof. Although example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A majority gate device, comprising:
   a plurality of input zones;
   an output zone; and
   a magnetic tunneling junction (MTJ) formed in each of the input zones and the output zone, the MTJ comprising a non-magnetic layer interposed between a free layer stack and a hard layer, the free layer stack comprising:
      a bulk perpendicular magnetic anisotropy (PMA) layer on a seed layer, and
      a magnetic layer formed directly on and in physical contact with the bulk PMA layer,
      wherein the non-magnetic layer is formed on the magnetic layer,
   wherein each of the bulk PMA layer and the seed layer serves as a common layer for each of the input zones and the output zone.

2. The majority gate device according to claim 1, wherein the hard layer comprises a ferroelectric material having a fixed magnetization parallel to a layer normal direction, wherein the non-magnetic layer comprises MgO, and wherein the free layer stack comprises a ferroelectric material having a magnetization direction parallel to the layer normal direction that changes in response to spin-polarized current passing through the MTJ.

3. The majority gate device according to claim 1, wherein the magnetic layer serves as a common layer for each of the input zones and the output zone.

4. The majority gate device according to claim 3, wherein the non-magnetic layer serves as a common layer for each of the input zones and the output zone.

5. The majority gate device according to claim 1, wherein the bulk PMA layer comprises a bilayer comprising a first layer and a second layer.

6. The majority gate device according to claim 5, wherein the bulk PMA comprises a plurality of repeating bilayers.

7. The majority gate device according to claim 5, wherein each of the first layer and the second layer has a thickness in a range between 0.2 nm and 2 nm.

8. The majority gate device according to claim 5, wherein the first layer comprises one or more of FeB, Fe, Co and FeCo, and wherein the second layer comprises one or more of Ni, Pd, Pt, Tb, TbCo and TbFe.

9. The majority gate device according to claim 1, wherein the bulk PMA layer comprises one or more of FePt, CoPt, TbCoFe alloys and $Mn_xA_y$ alloy, wherein A is Al, Ga or Ge and 0<x,y.

10. The majority gate device according to claim 1, wherein the free magnetic layer further comprises an interface layer interposed between the magnetic layer and the bulk PMA layer.

11. The majority gate device according to claim 10, wherein the interface layer serves as a common layer for each of the input zones and the output zone.

12. The majority gate device according to claim 10, wherein the interface layer comprises a material suitable for enhancing the texture of the magnetic layer and providing ferromagnetic coupling between the bulk PMA layer and the magnetic layer.

13. The majority gate device according to claim 10, wherein the interface layer comprises a material selected from the group consisting of Ta, Mo, W, V, Ru, or from an alloy selected from the group consisting of CoFeBX, CoX, FeX and FeCoX, wherein X is any of Ta, Mo, W, V or Ru.

14. The majority gate device according to claim 1, wherein the seed layer comprises a material selected from the group consisting of Pt, Ru, Ta, NiCr, Hf, TaN, W, Mo and combinations thereof.

15. The majority gate device according to claim 1, wherein the magnetic layer comprises a material selected from the group consisting of Fe, CoFe, CoFeB, FeB, CoB and combinations thereof.

16. The majority gate device according to claim 1, wherein each of the input zones and the output zone comprises a patterned pillar, the patterned pillar comprising layers other than layers serving as common layers.

17. The majority gate device of claim 1, wherein the majority gate device is a logic device configured to output a logical state that is the same as logical states of a majority of the input zones.

18. A majority gate device, comprising:
a plurality of input zones;
an output zone; and
a magnetic tunneling junction (MTJ) formed in each of the input zones and the output zone, the MTJ comprising a non-magnetic layer interposed between a free layer stack and a hard layer, the free layer stack comprising:
a bulk perpendicular magnetic anisotropy (PMA) layer on a seed layer, and
a magnetic layer formed on and in contact with the bulk PMA layer,
wherein the non-magnetic layer is formed on the magnetic layer,
wherein each of the bulk PMA layer and the seed layer serves as a common layer for each of the input zones and the output zone, and
wherein the hard layer comprises oxidized portions, wherein the hard layer serves as a common layer for each of the input zones and the output zone, and wherein one of the oxidized portions is formed between adjacent ones of the input zones and the output zone.

* * * * *

UNITED STATES PATENT AND TRADEMARK OFFICE
CERTIFICATE OF CORRECTION

PATENT NO. : 10,170,687 B2
APPLICATION NO. : 15/387350
DATED : January 1, 2019
INVENTOR(S) : Johan Swerts Page 1 of 1

It is certified that error appears in the above-identified patent and that said Letters Patent is hereby corrected as shown below:

In the Specification

Column 3, Line 25, delete "aspec," and insert --aspect,--.

Column 8, Line 21, delete "(0.6 nm))]4" and insert --(0.6 nm)]4--.

In the Claims

Column 14, Line 43, Claim 6, after "according" insert --to--.

Signed and Sealed this
Tenth Day of March, 2020

Andrei Iancu
*Director of the United States Patent and Trademark Office*